(12) United States Patent
Zhang et al.

(10) Patent No.: US 6,563,393 B2
(45) Date of Patent: May 13, 2003

(54) METHOD AND DEVICE FOR PULSE DENSITY MODULATION

(75) Inventors: Tao Zhang, Singapore (SG); Hiroshi Katsuragawa, Singapore (SG); Noriyoshi Ito, Singapore (SG)

(73) Assignee: Oki Techno Centre (Singapore) Pte Ltd. (SG)

( * ) Notice: Subject to any disclaimer, the term of this patent is extended or adjusted under 35 U.S.C. 154(b) by 0 days.

(21) Appl. No.: 09/961,884

(22) Filed: Sep. 24, 2001

(65) Prior Publication Data

US 2002/0048318 A1 Apr. 25, 2002

(30) Foreign Application Priority Data

Sep. 27, 2000 (SG) .......................................... 200005512

(51) Int. Cl.$^7$ ............................ H03C 3/00; H03K 7/00; H03M 1/66
(52) U.S. Cl. ....................... 332/106; 332/112; 341/144; 375/239
(58) Field of Search ................................ 332/106–108, 332/112–114; 375/239; 341/126, 144, 155

(56) References Cited

U.S. PATENT DOCUMENTS

| 5,337,338 A | 8/1994 | Sutton et al. .................. 377/33 |
| 5,995,546 A | 11/1999 | Richardson .................. 375/237 |
| 6,208,279 B1 * | 3/2001 | Oprescu ...................... 341/143 |

* cited by examiner

Primary Examiner—David C. Mis
(74) Attorney, Agent, or Firm—Ostrolenk, Faber, Gerb & Soffen, LLP

(57) ABSTRACT

A pulse density modulator unit transforms an N-bit input signal representing an input value, into an output digital signal having a digital pulse density which is a linear function of the input value. The pulse density modulator unit includes a first pulse density modulator which produces a binary signal representing a multiplication factor as a pulse density. It further includes a combination module which receives the input signal, the binary signal from the first pulse density modulator and an offset control signal. The combination module produces a combined signal which, on average, represents the product of the input signal and the amplification control signal, offset by an amount dependent upon the offset control signal. A second pulse generator uses the combined signal to generate the output digital signal. The combination module may be a selector.

14 Claims, 4 Drawing Sheets

METHOD AND DEVICE FOR PULSE DENSITY MODULATION

FIELD OF THE INVENTION

The present invention relates to a method and device for pulse density modulation, that is for generating from an input value an output digital signal in which represents the input value by the density of digital pulses.

BACKGROUND OF THE INVENTION

Many applications require conversion of a series of multi-bit digital signal into a pulse density signal. For example, in many telecommunications applications, the receiver converts the received digitally encoded voice signal to analogue audio, reproducing the original voice sounds. In some feedback control circuits, the control signal is calculated and represented as a multi-bit digital signal, and this signal should be converted to an analogue signal to control the controlled devices. One way to convert the multi-bit signal to analogue signal is to convert the multi-bit signal to a pulse density signal first, and then filter the pulse density signal to analogue signal by an RC filter.

We now describe the function of a known pulse density modulator (PDM), A more detailed discussion is given in U.S. Pat. No. 5,337,338, the disclosure of which is incorporated herein by reference. The PDM receives a series of digital clock signals separated by a period $p_w$, and a multi-bit digital signal representing an input value. From these two inputs, the PDM generates a 1-bit digital signal, i.e. a signal with just two possible voltage values, which we may refer to as 0.0V and $V_{OH}$. Any time interval of length $p_w$ for which the voltage output of the PDM is a certain one of these values (generally, the higher one, $V_{OH}$) is referred to as a pulse, so that the pulse density in the output signal is the proportion of the output signal which takes the voltage value $V_{OH}$. The PDM is arranged such that the output signal has a pulse density proportional to the input value. Thus, the multi-bit input signal has been converted to a 1-bit signal.

In certain applications, the output signal is converted to an analogue signal corresponding to the (digital) input signal. If the clock frequency used to generate the pulse is high enough relative to the frequency of the incoming signal, the information lost can be within a tolerable range. Usually only 2 passive components (a resister and a capacitor) for an RC filter, are required to provide a low-ripple analogue signal.

A number of varieties of PDMs are known. One of these, described in U.S. Pat. No. 5,337,338, is illustrated in FIG. 1. This PDM processes an N-bit digital input signal 4. An N-bit counter 20 receives a high-rate clock signal 1. The output of the N-bit counter 20 at every clock cycle is inverted (shown schematically by the region 22) and fed (as input Q) to an N-bit comparer 24, which also receives (as input P) the N-bit input signal 4. If P is greater than or equal to Q, the output of the comparer 24 is voltage high; otherwise it is low.

The N-bit input value represented by the input signal 4 will be in the range $0 \sim 2^N-1$. If the input value is stable at x, then during the period of the counter 20, that is $2^N$ clock cycles (i.e. a time period of $2^N p_w$), the output of the comparer 24 is high for x+1 of the $2^N$ clock cycles, i.e. for a total time equal to the x+1 multiplied by $p_w$. Note that the output of the counter 20 and the comparer 24 are each periodic with a length of $2^N$ clock cycles. The purpose of the bit inversion 22 is to uniformly distribute the times at which the voltage output of the comparer 24 is high uniformly through the period of the counter.

If the arrangement of FIG. 1 is varied so that the output of the comparer 24 is high only if "P>Q" (instead of "P>=Q"), there will be x pulses in the period of the counter. Thus, the output pulse number in one period of the counter can be set to 0 to $2^N-1$, or 1 to $2^N$, according to the setting of comparer 24.

U.S. Pat. No. 5,995,546 proposes an alternative PDM illustrated in FIG. 2. In this case the N-bit input signal 4 is passed to an adder 30. The adder 30 also receives an N-bit input from an N-bit register 32. At each clock cycle, the adder 30 adds the input signal 4 and the signal from the register 32. The N-bit result of the addition is sent back to the register 32. The register 32 also receives a clock signal, and the content of this register is updated at each clock cycle. If the addition operation results in an overflow then the value (voltage high) is sent to a 1-bit latch 34, which is also controlled by the clock signal. If the addition operation resulted in no overflow, the value sent to latch 34 is voltage low.

If input value is stable at x, the output of the latch 34 is a periodic repetition with a length of $2^N$ clocks cycles. In each $2^N$ clock cycles, there are x pulses. Thus, this system can output a number of pulses in one period in the range 0 to $2^N-1$. If for some applications, an output range of 1 to $2^N$ is needed, one method is to change the input from x to $2^N-x$ (i.e. each bit is inverted from "1" to "0" or "0" to "1") and invert the output bit in the same way.

Comparing with in U.S. Pat. No. 5,337,338, the PDM in U.S. Pat. No. 5,995,546 has the better performance because it has a more uniformly distribution of output pulses. For example, it is preferable for the PDM to have an output like " . . . 10101010 . . . ", rather than " . . . 11001100 . . .", even though their output pulse densities are the same, 50%, since in the former case the ripple after passing through the RC circuit will be lower.

SUMMARY OF THE INVENTION

As discussed above, in some applications, the PDM output signal is used to control an analogue device. In these conditions, the performance is improved if the output of the PDM has a pulse density according to a linear transformation of the input value. This is because most voltage-controlled analogue devices require that the input control voltage range, which is a fractional portion of power supply, is within a limited range.

The limitation of PDM output range may be caused by a limited dynamic range in the input controlling signal to the controlled device, or, caused by a requirement of whole system. One way to limit the range of the PDM output, is to limit the input range to the PDM; for example, to apply a hard clipper before PDM or a linear transformation before the PDM (with a multi-bit multiply and add operation). However both methods will cause degradation of resolution of the PDM (average output range/input range). This invention aims to make it possible to limit the range of the PDM output by applying a linear transformation within the PDM. One advantage of this is to avoid the resolution degradation caused by the limited input range. It also avoids the multi-bit multiply and adder operation required to perform a linear transformation before the PDM.

In its most general terms the present invention proposes a pulse density modulator unit which converts a series of multi-bit input signal representing an input value, into an output digital signal which represents an output value as a digital pulse density. The output value is a linear function of the input value.

The pulse density modulator unit includes a combination module which receives the input signal, and also a signal which encodes a multiplication factor as a pulse density. The combination module combines its inputs, and so produces a combined signal which, on average, depends on the input signal multiplied by the multiplication factor. Please note that this multiplication is very simple since one of the inputs is only 1 bit. A pulse density modulator uses the combined signal to generate the output digital signal.

Thus, the input value (which may take any of $2^N$ values) may be transformed by means of the invention into any range of output values, such as a range of values less than $2^N$ wide. Even in this case, the average value of the combined signal can take any one of $2^N$ values within this range (i.e. values spaced apart by less than 1) according to the input value, and this freedom is preserved in the output digital signal. Hence the N-bit resolution of the input value is not lost.

Preferably, the combination module also receives an offset control signal which depends upon an offset value, and the combined signal produced by the combination module represents the input signal multiplied by the multiplication factor and offset by the offset value. In some embodiments, the offset control signal is just an N-bit representation of the offset value itself. Alternatively, in embodiments which produce an offset which depends upon the offset control value and the multiplication factor (e.g. embodiments which give an offset which is the number represented by the N-bit offset control signal multiplied by an number which depends upon the multiplication factor), the offset control signal may be derived from the desired offset, and selected so as to produce the desired offset. In fact, a unit may be provided to generate a suitable offset control signal from a desired offset value.

Specifically, the invention proposes a pulse density modulator unit which converts a multi-bit digital input signal representing an input value, into an output digital signal which represents an output value as a digital pulse density, the pulse density modulator unit comprising:
 a first pulse generation module which produces a pulse density signal encoding a multiplication factor as a pulse density;
 a combination module which receives (i) the input signal, and (ii) the pulse density signal from the first pulse generation module, the combination module producing a combined signal representing a combined value, the time average of the combined value depending upon the input value multiplied by the multiplication factor; and
 a second pulse generation module which uses the combined signal to generate the output digital signal.

Typically, the first pulse generation module is a (e.g. conventional) PDM module, which receives the multiplication factor in the form of a multi-bit multiplication control signal, and converts it into a binary pulse density.

Preferably, the combination module is a selector, which receives the input signal, the pulse density signal encoding the multiplication factor, and the offset control signal, and uses the pulse density signal to select for transmission one of the input signal and the offset control signal.

In a first possibility, the pulse density signal encodes the multiplication factor by the pulse density simply being equal to the multiplication factor itself. In this case, the selector can perform the multiplication of the input value by the multiplication factor by selecting the input value whenever the pulse density signal is high, The selector performs a multiplication of the offset control value by 1 minus the multiplication factor by selecting the offset control value whenever the pulse density signal is low.

A second possibility, is that the pulse density signal encodes the multiplication factor by the pulse density being 1 minus the multiplication factor. In this case, the selector can perform the multiplication of the input value by the multiplication factor by selecting the input value whenever the pulse density signal is low. The selector performs the multiplication of the offset control value by the multiplication factor by selecting the offset control value whenever the pulse density signal is high.

The arrangement of the invention permits the reduction, or avoidance, of the resolution degradation caused by the characteristics of analogue device. For example, if the input to the PDM is in the range 0–511, the PDM of the present invention may perform a map from 0–511 to 85–358 during 512 clock cycles (The present invention changes the PDM output period. However to simplify the analysis, we calculate the average value during 512 clock cycles). By means of the invention, the period of the output signal may be lengthened, and the real LSB resolution made $[(358-85)/512*V_{OH}]/512=0.00104\ V_{OH}/\text{bit}$.

The reason why the effective period of the output of the PDM of the present invention is longer than that of the present invention, is as follows. Suppose that the multiplication factor is 1 and the offset control value is 0,that is, the present invention equivalent to a known PDM, and the output period will be the same with traditional PDM, i.e. 512. However, if the multiplication factor is ½ and the offset control value is 0, when first PDM output is high, the present PDM works as traditional PDM, that is, the output period is 512 only if the first PDM is high. And if first PDM output is low, the present invention just outputs 0. So the present invention has the effect of inserting a number of 0s into the output of the known PDM dependent on the multiplication factor. If multiplication factor is ½, then 512 0s are inserted. In this case, the output period of the present invention is 1024. If multiplication factor is ⅓, the period of a PDM which is an embodiment of the present invention is 512×3.

The linear transformation of the input value may, for example, be written as:

$$y=(358-85)*x/(511-0)+85=273*x/511+85, \qquad (1)$$

where, x, y are the input and output of the transformation respectively. The multiplication factor is 273/511, which is about 274/512. So the input signal to the first PDM is 274.

Note that this transformation cannot be performed before the PDM unit (and thus the LSB resolutions cannot be improved) since transforming a first N-bit digital signal taking values 0 to 511 into an N-bit signal taking values 85 to 358 would inevitably involve a loss of resolution. In this case, the LSB resolution is $[(358-85)/512*V_{OH}]/(358-85)=0.00195\ V_{OH}/\text{bit}$.

BRIEF DESCRIPTION OF THE FIGURES

Embodiments of the invention will now be described for the sake of example only with reference to the following figures, in which.

DESCRIPTION OF THE EMBODIMENTS

Figure 1:
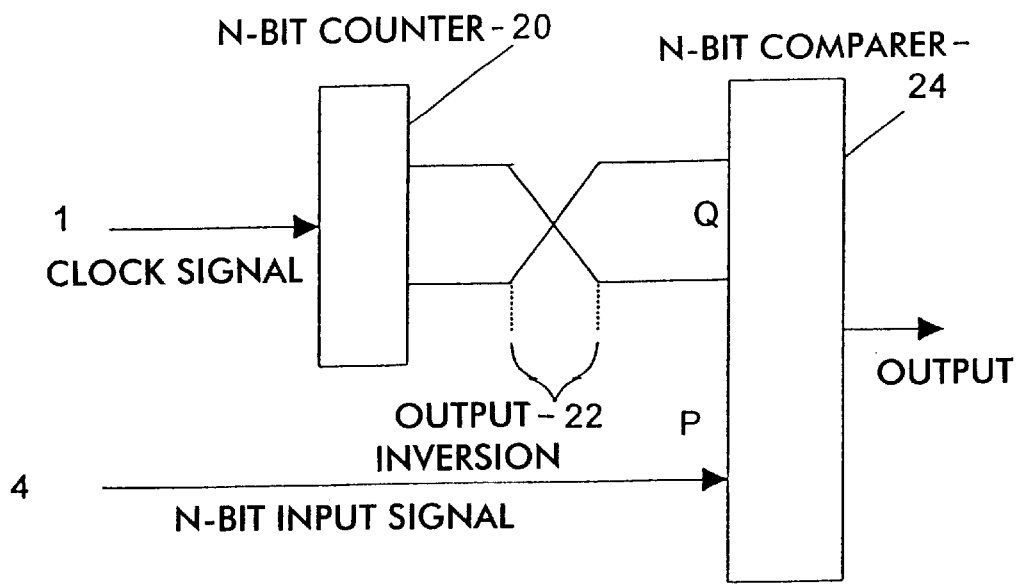
FIG. 1 is a diagram of a first known PDM module.
Figure 2:
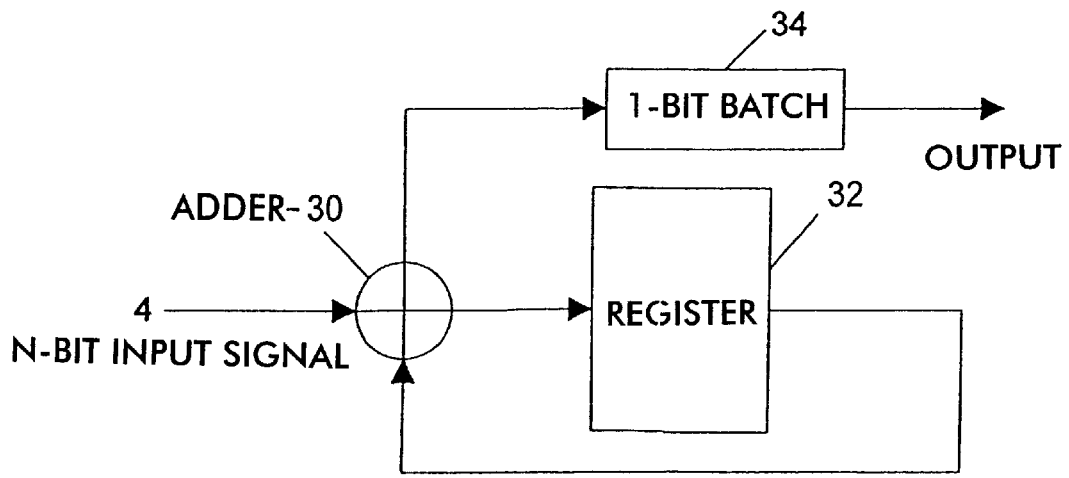
FIG. 2 is a diagram of a second known PDM module.
Figure 3:
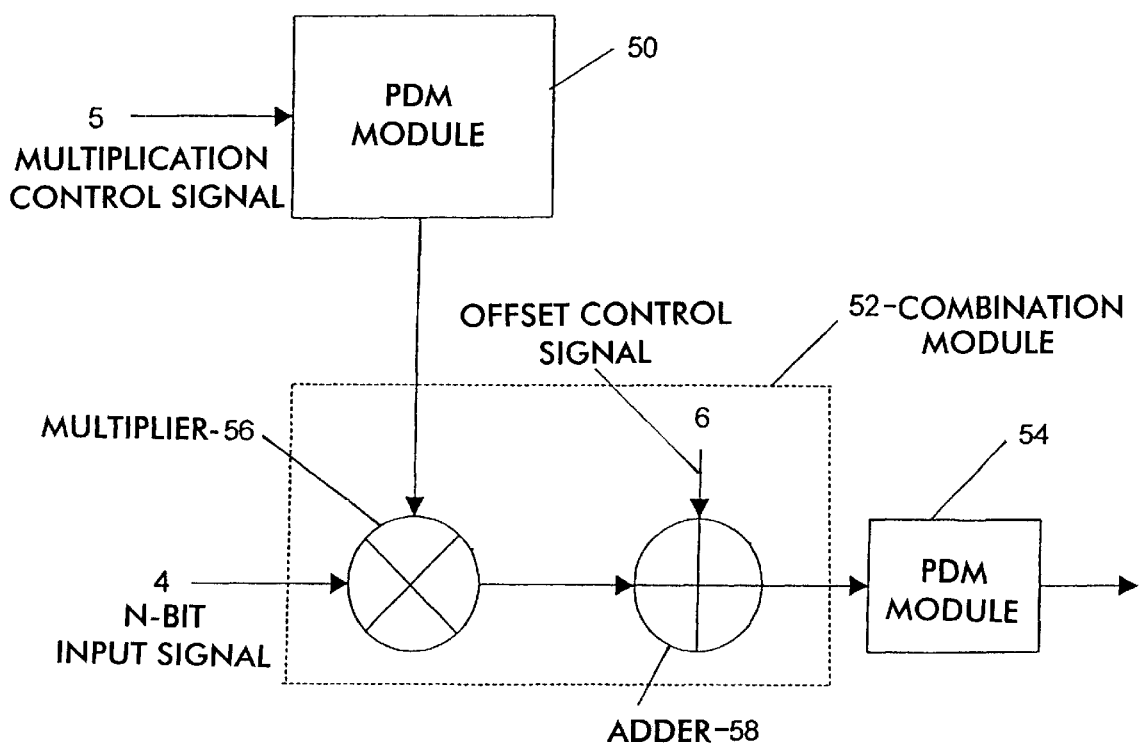
FIG. 3 is a diagram of a first embodiment of the invention.

A first embodiment of the invention, which implements the equation (1) directly, is shown in FIG. 3. As in the preceding figures, the reference numeral 4 represents the N-bit input signal to be converted to a (binary-valued) digital pulse density signal. The first embodiment also receives a multiplication control signal 5 (of value 274 in the example) which is converted into a pulse density signal by a first PDM module 50 (which may be a conventional PDM, such as the one described in U.S. Pat. No. 5,337,338 or U.S. Pat. No. 5,995,546 referenced above). The digital output of the first PDM module 50 is fed to a combination module 52 having a multiplier 56, which multiplies the input signal 4 by the digital signal from the PDM 50 and passes it to an adder 58, which multiplies it by an offset control signal 6 (of value 85 in the example). The output of the combination module 52 (which is N+1 bit to avoid overflow) is transmitted to the second PDM module 54 (which again may be a conventional PDM, such as the one described in U.S. Pat. No. 5,337,338 or U.S. Pat. No. 5,995,546 referenced above).

The two PDM modules may employ the same clock signal. However, it is possible for them employ different clock signals of different frequency if these two clocks are synchronised. For example, the clock for first PDM module may employ a clock frequency is a fraction of that for the second PDM module, for example, ½ or ⅓.Although this may cause some performance degradation, it can also result in a power saving The principle of this first embodiment is as follows: in one 512 period, the density of pulses in the output of first PDM 50 is 274, so the average output of the multiplier 56 is $274*x/512$. And the average output of the adder 58 is $274*x/512+85$.

Employing the first embodiment in a control system would thus give a system in which after the RC filter 16, the output voltage=$(274*x/512+85)/512*V_{OH}$, where x is the input The dynamic range of x is 0~511. When x=0, then the output=$(274*0/512+85)/512*V_{OH}=85/512*V_{OH}$; when x=511, then, the output=$(274*511/512+85)/512*V_{OH}$, which is approximately equal to $358/512*V_{OH}$. So the average voltage output of RC is between $85/512*V_{OH}$ and $358/512*V_{OH}$.

Figure 4:
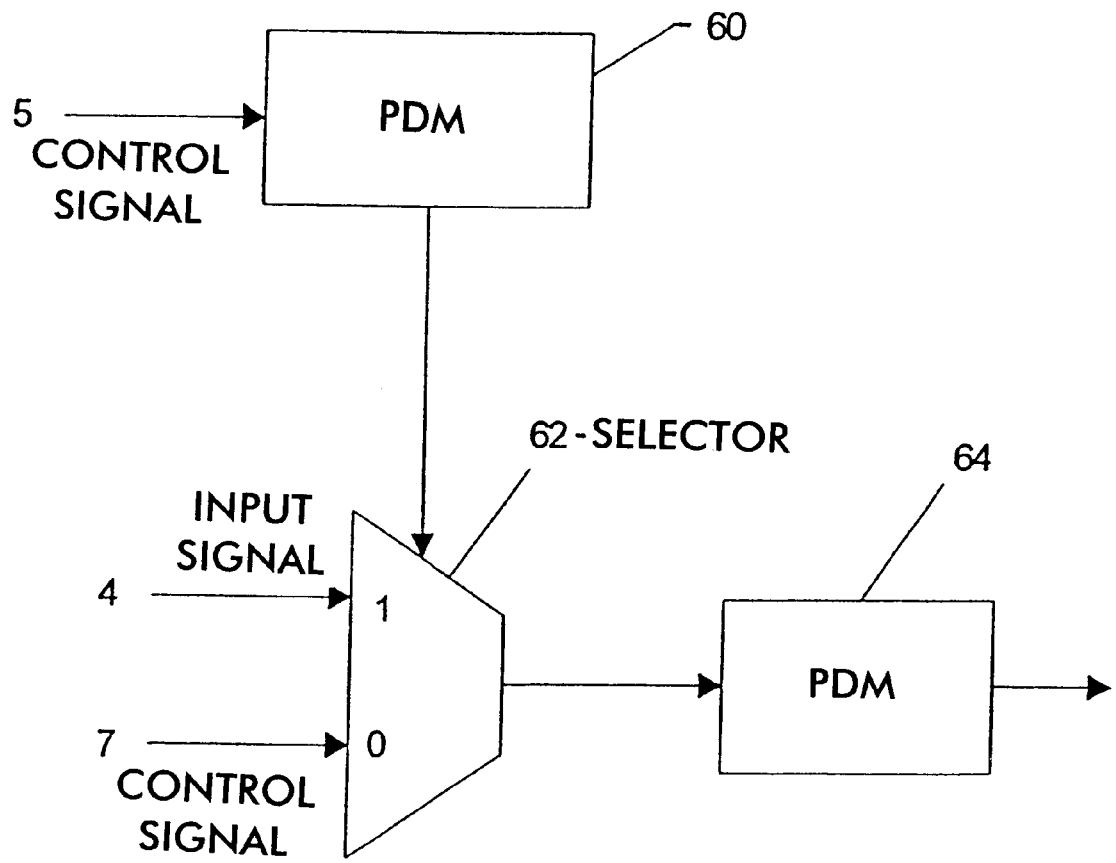
FIG. 4 is a diagram of a second embodiment of the invention.

FIG. 4 shows a second embodiment of the invention. In this second embodiment, PDMs 60 and 64 are respectively equivalent to PDMs 50 and 54 in FIG. 3, but the combination module 52 is replaced by a selector 62. The selector 62 receives the input signal 4, and also an offset control signal 7, which is calculated from equation (2). The selector 62 outputs a value equal to the signal 4 whenever the input from the PDM 60 is 1, and a value equal to signal 7 whenever the input from the PDM 60 is 0.

The motivation for this second embodiment arises by noting that equation (1) can be re-written:

$$y=274*x/512+(512-274)/512*183 \quad (2)$$

This is the average output of the selector 62, i.e. x for a proportion of time 274/512 and 183 for the rest of the time.

Comparing FIG. 4 with FIG. 3, one adder is removed, and input to second PDM can still kept N bit without there being a risk of overflow. To avoid this risk, not only the adder, but also the $2^{nd}$ PDM should adopt N+1 bits.

Figure 5:
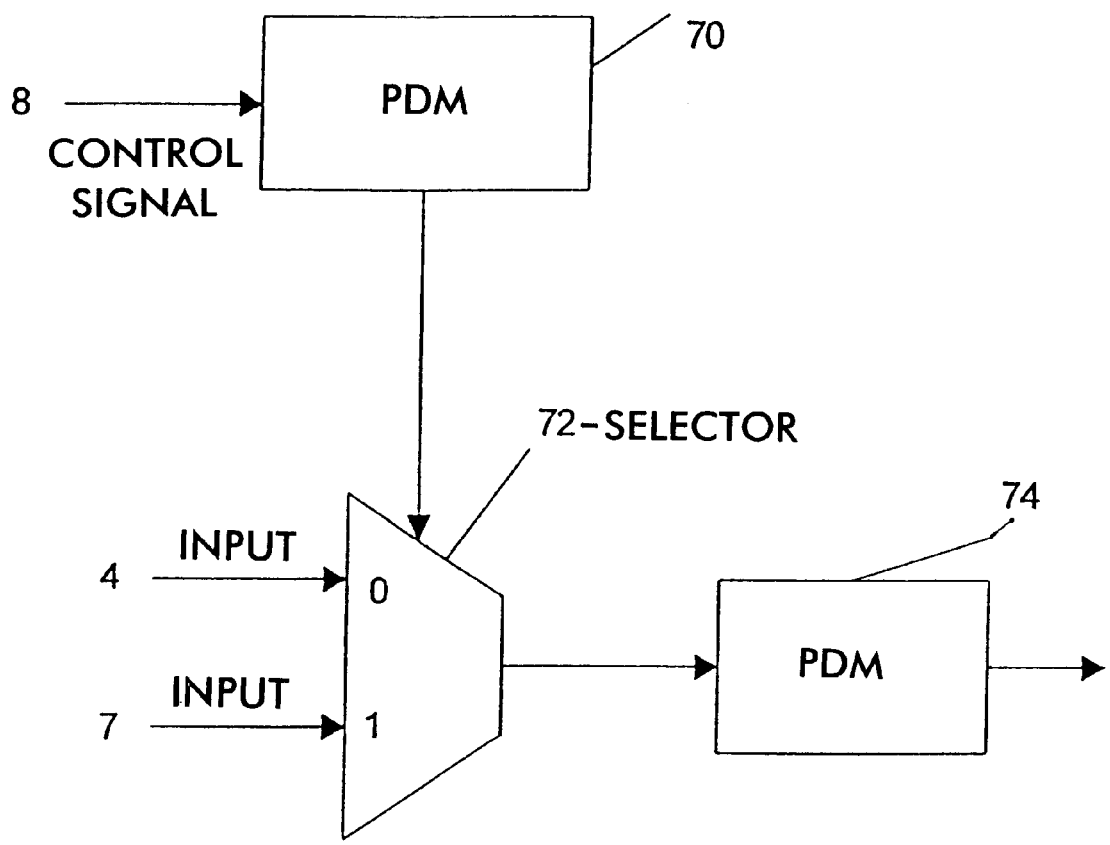
FIG. 5 is a diagram of a third embodiment of the invention.

FIG. 5 shows a third embodiment of the invention, having PDMs 70, 74 respectively equivalent to the PDMs 60 and 64 of FIG. 4. Compared to FIG. 5, the signal 5 of value 274 in FIG. 5 is replaced by a signal 8 of value 238, but the signal 7 of value 183 is unchanged. The selector 74 has been modified to output the input 4 when the first PDM 70 outputs a high value "1", and to output the input 7 otherwise. This embodiment is motivated by re-writing (2) as:

$$y=(512-238)512*x+238/512*183 \quad (3)$$

Note that the embodiments of FIGS. 3 to 5 may be modified in various ways.

Firstly, although the values of the signals 5, 6, 7, 8 in FIGS. 3 to 5 have been selected to give an output from the second PDM 54, 64, 74 in the range 85 to 358, of course the values of the signals 5, 6, 7, 8 may be modified to produce other linear transformations of the input signal 4.

If the ratio of the output period (here 512) to the value represented by the input signal 5, 8 to the first PDM 50, 60, 70, can be reduced to a simple fraction, or can be approximated as a simple fraction, the PDMs 50, 60, 70 may be replaced with simplified PDMs. For example, taking the linear transform example considered above, if it is sufficiently accurate to approximate the ratio 512 to 274 to the ratio 32 to 17, the PDMs 50, 60 70 may be implemented to receive a 5-bit signal instead of 9 bits, at the same time, the input to first PDM, 274, will be replaced by 17. In other words, if the accuracy is not very critical, a lower bit integration may be adopted. Furthermore, the invention may be implemented so that the signals 5, 6, 7, 8 are not pre-set, but are adjustable so that the linear function performed by the PDM of the invention may be varied. For example, each of the embodiments shown respectively in FIGS. 3 to 5 may further include a register (e.g. an N-bit register) for respectively storing the values which are used to produce either or both of signals 5 and 6 (in the first embodiment), 5 and 7 (in the second embodiment) and 7 and 8 in the third embodiment. Each of the signals 5, 6, 7, 8 may be stored in a register for transmission into the arrangements shown in FIGS. 3 to 5. Thus, the linear function performed by the embodiment may be changed by changing the value stored in the respective register.

In the case that such a programmable register is provided to store the value 5, 7 to the first PDMs 50, 60, 70, the bit width of register may be a 9 bit register, so that the stored value is in the range from 0~511. In the third embodiment (FIG. 5), if the first PDM 70 outputs no pulses at all, the input signal 4 would have no effect at all; thus it may be worthwhile, to avoid this possibility by arranging that the first PDM 50, 60, 70 generates an output value in the range from 1~512 (rather than 0~511). In this way, the flexibility of the control range is improved.

What is claimed is:

1. A pulse density modulator unit which converts a multi-bit digital input signal representing an input value, into an output digital signal which represents an output value as a digital pulse density, the pulse density modulator unit comprising:

a first pulse generation module which produces a pulse density signal encoding a multiplication factor as a pulse density;

a combination module which receives (i) the input signal, and (ii) the pulse density signal from the first pulse generation module, the combination module producing a combined signal representing a combined value, the time average of the combined value depending upon the input value multiplied by the multiplication factor; and a second pulse generation module which uses the combined signal to generate the output digital signal.

2. A pulse density modulator unit according to claim 1 in which the combination module further uses an offset control signal which depends upon an offset value, and the time average of the combined value being the input value multiplied by the multiplication factor and offset by an amount depending upon the offset value.

3. A pulse density modulator unit according to claim 2 further including means to generate said offset control signal using the offset value.

4. A pulse density modulator unit according to claim 2 further including a first register for storing the offset value and transmitting the offset control signal to the combination module.

5. A pulse density modulator unit according to claim 4 in which the offset value stored in the first register is adjustable.

6. A pulse density modulator unit according to claim 2 in which the combination module includes a multiplication device for multiplying the input value and the multiplication factor, and an addition device for adding an amount dependent upon the offset value.

7. A pulse density modulator unit according to claim 2 in which the combination module is a selector which uses the pulse density signal encoding the multiplication factor to select for transmission one of the input signal and the offset control signal.

8. A pulse density modulation unit according to claim 7 in which the pulse density of the signal produced by the first pulse generation module is equal to the multiplication factor, and the selector selects for transmission the input value whenever the pulse density signal is high and the offset control signal otherwise.

9. A pulse density modulation unit according to claim 7 in which the pulse density of the signal produced by the first pulse generation module is 1 minus the multiplication factor, and the selector selects for transmission the input value whenever the pulse density signal is low, and the offset control signal otherwise.

10. A pulse density modulator unit according to claim 1 in which the first pulse generation module is a pulse density modulation module which receives a multi-bit signal encoding the multiplication factor and from it produces the signal encoding the multiplication factor as a pulse density.

11. A pulse density modulation unit according to claim 10 in which the multi-bit signal received by the first pulse generation module has fewer digits than said input signal.

12. A pulse density modulation unit according to claim 10 in which the first pulse generation module is arranged to generate pulses irrespective of the value of the multiplication factor.

13. A pulse density modulation unit according to claim 10 further including a second register storing the multi-bit signal for transmission to the first pulse generation module.

14. A pulse density modulation unit according to claim 13 in which said value stored in the second register is adjustable.

* * * * *